United States Patent
Chen

(10) Patent No.: US 10,314,196 B2
(45) Date of Patent: Jun. 4, 2019

(54) REINFORCED SERVER SLIDING RAIL MOUNTING STRUCTURE

(71) Applicant: GSLIDE CORPORATION, New Taipei (TW)

(72) Inventor: Yung-Liang Chen, Taipei Shien (TW)

(73) Assignee: GSLIDE CORPORATION, New Taipei (TW)

( * ) Notice: Subject to any disclaimer, the term of this patent is extended or adjusted under 35 U.S.C. 154(b) by 159 days.

(21) Appl. No.: 15/448,740

(22) Filed: Mar. 3, 2017

(65) Prior Publication Data
US 2017/0303426 A1 Oct. 19, 2017

(30) Foreign Application Priority Data
Apr. 13, 2016 (TW) .............................. 105108343 A

(51) Int. Cl.
*H05K 7/18* (2006.01)
*A47B 96/07* (2006.01)
*H05K 7/14* (2006.01)

(52) U.S. Cl.
CPC ............. *H05K 7/183* (2013.01); *A47B 96/07* (2013.01); *H05K 7/1489* (2013.01)

(58) Field of Classification Search
CPC ....... A47B 96/07; A47B 88/483; A47B 88/43; H05K 7/183; H05K 7/1489
See application file for complete search history.

(56) References Cited

U.S. PATENT DOCUMENTS

| | | | | |
|---|---|---|---|---|
| 3,431,042 A | * | 3/1969 | Pipe ..................... | A47B 88/493 384/18 |
| 3,743,366 A | * | 7/1973 | Tazaki ................. | A47B 88/493 312/334.9 |
| 5,295,748 A | * | 3/1994 | Yamazaki ........... | F16C 29/0607 29/898.03 |
| 6,070,957 A | * | 6/2000 | Zachrai ................... | H02B 1/32 312/265.1 |
| 8,028,965 B2 | * | 10/2011 | Chen .................... | H05K 7/1489 248/298.1 |
| 8,303,183 B2 | * | 11/2012 | Chen .................... | A47B 88/487 312/334.11 |

(Continued)

FOREIGN PATENT DOCUMENTS

TW M286559 U 4/1994
TW M313945 U 12/1995
(Continued)

*Primary Examiner* — Ko H Chan
(74) *Attorney, Agent, or Firm* — Cook Alex Ltd.

(57) ABSTRACT

A reinforced server sliding rail mounting structure for connection to a server rack and to a server includes an inner sliding rail, a first ball bushing, an intermediate sliding rail, a second ball bushing and an outer sliding rail. A front bracket has an upper reinforcing rib and a lower reinforcing rib respectively located on upper and lower bracket walls thereof such that when the intermediate sliding rail is moved outward into the front bracket, the upper and lower reinforcing ribs are respectively engaged into respective outer ball grooves of the intermediate sliding rail and reinforce the structural strength of the intermediate sliding rail. The structure may further include top and bottom reinforcing components respectively located on respective rear ends of the upper and lower reinforcing ribs.

3 Claims, 20 Drawing Sheets

(56) References Cited

U.S. PATENT DOCUMENTS

| | | | | |
|---|---|---|---|---|
| 8,721,180 B2* | 5/2014 | Li | ............... | F16C 33/6681 |
| | | | | 384/13 |
| 9,243,661 B1* | 1/2016 | Kuo | ............ | F16C 29/0638 |
| 2002/0074914 A1* | 6/2002 | Shih | ............ | H05K 7/1489 |
| | | | | 312/334.4 |
| 2008/0063326 A1* | 3/2008 | Chen | ............ | F16C 29/0607 |
| | | | | 384/45 |
| 2011/0101833 A1* | 5/2011 | Olesiewicz | ....... | H05K 7/183 |
| | | | | 312/223.2 |
| 2014/0265786 A1* | 9/2014 | Chen | ............ | H05K 7/1489 |
| | | | | 312/334.1 |
| 2016/0108955 A1* | 4/2016 | Kuo | ............ | F16C 29/0638 |
| | | | | 384/55 |

FOREIGN PATENT DOCUMENTS

| TW | M257691 U | 3/2005 |
|---|---|---|
| TW | 200843625 A | 11/2008 |
| TW | M427756 U | 4/2012 |
| TW | M462500 U | 9/2013 |

* cited by examiner

REINFORCED SERVER SLIDING RAIL MOUNTING STRUCTURE

BACKGROUND OF THE INVENTION

Field of the Invention

The present invention relates to server sliding rail technology and more particularly, to a reinforced server sliding rail mounting structure used in a server, which uses upper and lower reinforcing ribs to reinforce the structural strength of the intermediate sliding rail against deformation, and top and bottom reinforcing components to reinforce the structural strength of the coupling area between the intermediate sliding rail and the outer sliding rail, avoiding deformation of the server sliding rail assembly due to heavy loading or human factors when in the extended position.

Description of the Related Art

A sliding rail assembly for a server generally comprises an inner sliding rail, an intermediate sliding rail and an outer sliding rail. The inner sliding rail is adapted for fastening to the drawer (or server). The outer sliding rail is adapted for fastening to the cabinet or server rack. When in use, the drawer (or server) can be pulled outward with the inner sliding rail to carry the intermediate sliding rail out of the outer sliding rail to an extended position. When not in use, the drawer (or server) can be pushed inward with the inner sliding rail to carry the intermediate sliding rail back to a position inside of the outer sliding rail. The design of a sliding rail assembly consisting of inner, intermediate and outer sliding rails that can be moved between an extended position and an inward position has been known to the public. For example, Taiwan Patent Numbers M257691, M286559 and 1330067 disclose similar designs. Further, in order to facilitate mounting the outer sliding rail of a sliding rail assembly to a server rack, a front bracket and a rear bracket are respectively arranged at the opposing front and rear ends of the outer sliding rail. Similar mounting designs are seen in Taiwan Patent Numbers M313945, M427756 and M462500.

Further, if the customer wants to load a server chassis that weighs X kilograms (kg), the sliding rail assembly UL load test standard should be: multiply X kg by 1.5 and add to the total 30 kg a weight of 33 kg. For example, if the server chassis weighs 30 kg, then 30 kg×1.5=45 kg, and add 33 kg to the 45 kg to get total of 78 kg as a load test standard. Thus, for a prior art server sliding rail mounting structure, such as is shown in FIGS. 3-4, when the server sliding rail assembly is fully extended outward, it must be able to sustain a load of 78 kg for at least one minute, while avoiding having the server 96 fall and while allowing it to be smoothly moved to a closed position. When the test is passed, the server sliding rail assembly complies with UL safety regulations.

Further, in the two prior art designs of server sliding rail assemblies 91, 92 shown in FIGS. 1-2 and FIGS. 3-4, respectively, when the server sliding rail assembly 91 or 92 is fully extended outward, the inner sliding rail 911 or 921 bears the weight of the server 96 (see FIG. 3) and is disposed at the front side of the server rack 95. At this time, the intermediate sliding rail 912 or 922 is disposed at the back side of the front bracket 93 or 94 that is affixed to the outer sliding rail 913 or 923, and a gap 910 or 920 exists between the intermediate sliding rail 912 or 922 and the outer sliding rail 913 or 923 (see FIGS. 2 and 4). Due to the presence of the gap 910 or 920 in between the intermediate sliding rail 912 or 922 and the outer sliding rail 913 or 923, the intermediate sliding rail 912, 922 easily can be forced to deform by the weight of the load, causing damage and bringing trouble to the user. A manufacturer can increase the height of a server sliding rail assembly, so as to enhance the structural strength and stability. However, increasing the height of each server sliding rail assembly increases the cost and vertical dimension of the server sliding rail assembly, and will reduce the number of sliding rail assemblies mountable in the server rack. Therefore, it is desirable to provide a server sliding rail assembly, which has a strong structural strength for protection against deformation in the extended position without the need of increasing the height.

SUMMARY OF THE INVENTION

The present invention overcomes disadvantages of the prior art. The main object of the present invention is to provide a reinforced server sliding rail mounting structure for connection to a server rack and to a server, which includes an inner sliding rail, a first ball bushing, an intermediate sliding rail, a second ball bushing and an outer sliding rail, wherein a front bracket has an upper reinforcing rib and a lower reinforcing rib respectively located on upper and lower bracket walls thereof and when the intermediate sliding rail is moved outwardly into the front bracket, the upper and lower reinforcing ribs are engaged into respective outer ball grooves of the intermediate sliding rail and reinforce the structural strength of the intermediate sliding rail. Thus, when the server is moved outward with the inner sliding rail, the intermediate sliding rail is well reinforced by the upper and lower reinforcing ribs against deformation.

According to another aspect of the present invention, the front bracket of the reinforced server sliding rail mounting structure further comprises a top reinforcing component and a bottom reinforcing component located on respective rear ends of the upper and lower reinforcing ribs with a respective portion thereof adapted for engagement with respective outer ball grooves of the intermediate sliding rail and a respective opposite portion thereof adapted for engagement with respective inner ball grooves of the outer sliding rail. Thus, the top and bottom reinforcing components significantly reinforce the structural strength of the coupling area between the intermediate sliding rail and the outer sliding rail, avoiding deformation of the server sliding rail assembly due to heavy loading or human factors when in the extended position.

DETAILED DESCRIPTION OF THE PREFERRED EMBODIMENTS

Figure 1:
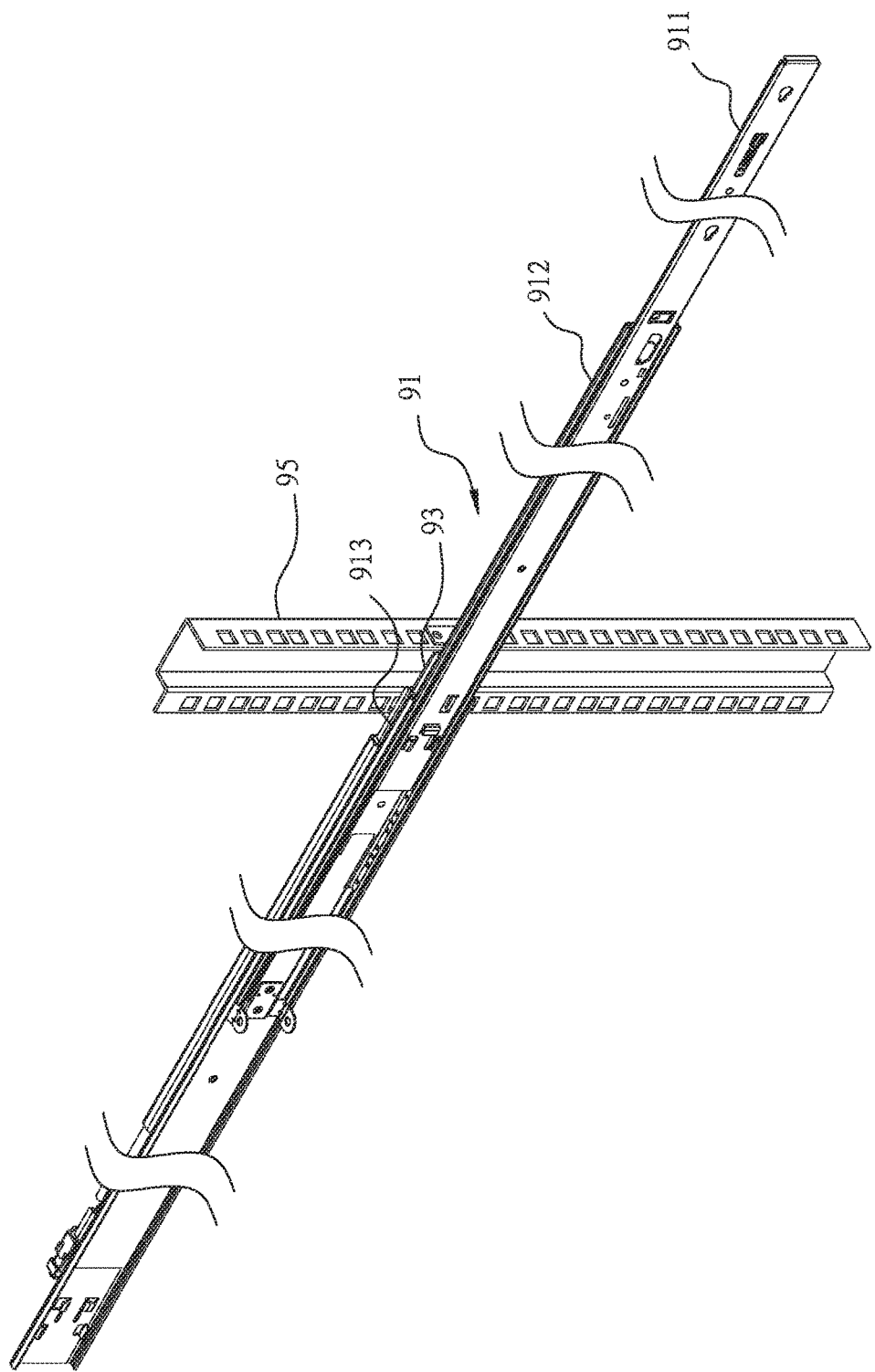
FIG. 1 is a schematic upper perspective view illustrating an extended position of a server sliding rail assembly in a server rack according to the prior art.
Figure 2:
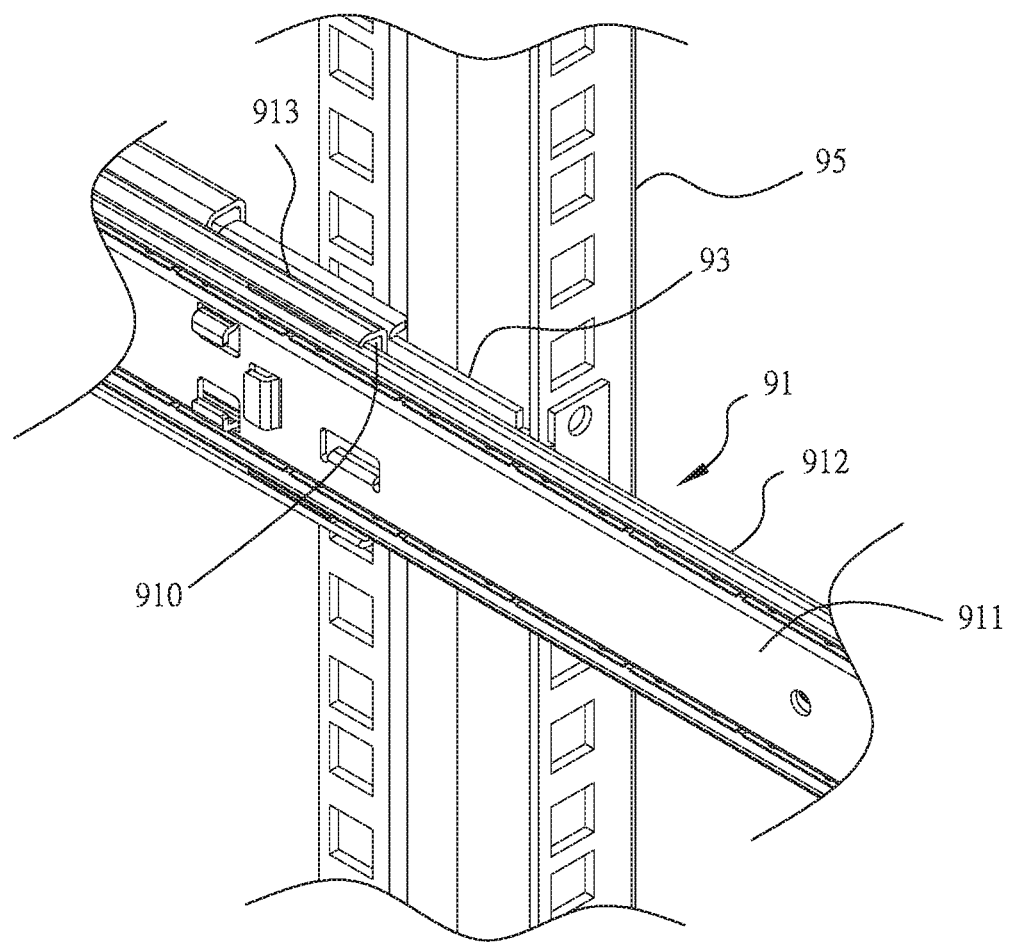
FIG. 2 is an enlarged view of a portion of FIG. 1 where the server sliding rail assembly is connected to the server rack.
Figure 3:
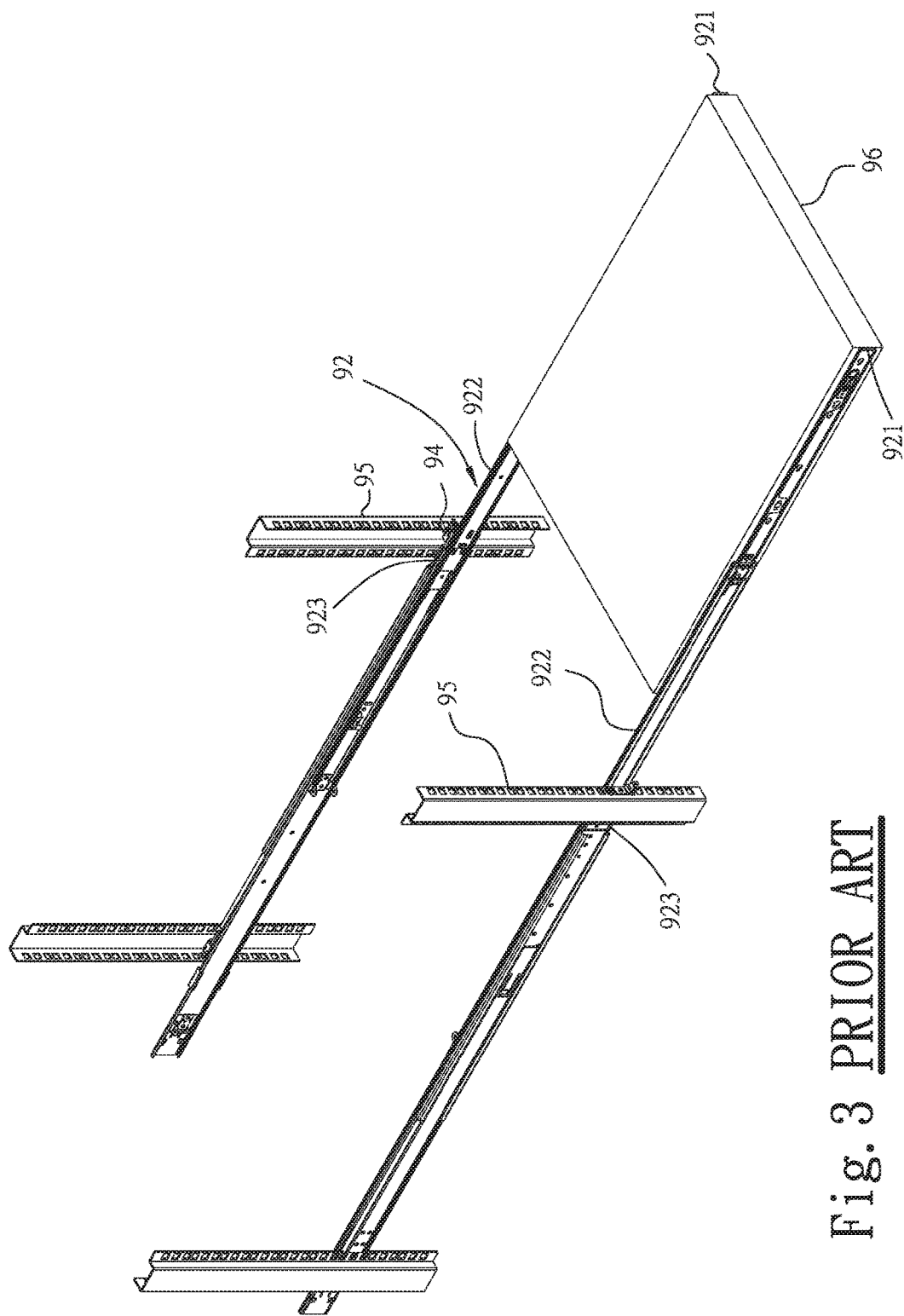
FIG. 3 is a schematic upper perspective view illustrating an extended position of another example server sliding rail assembly in a server rack according to the prior art.
Figure 4:
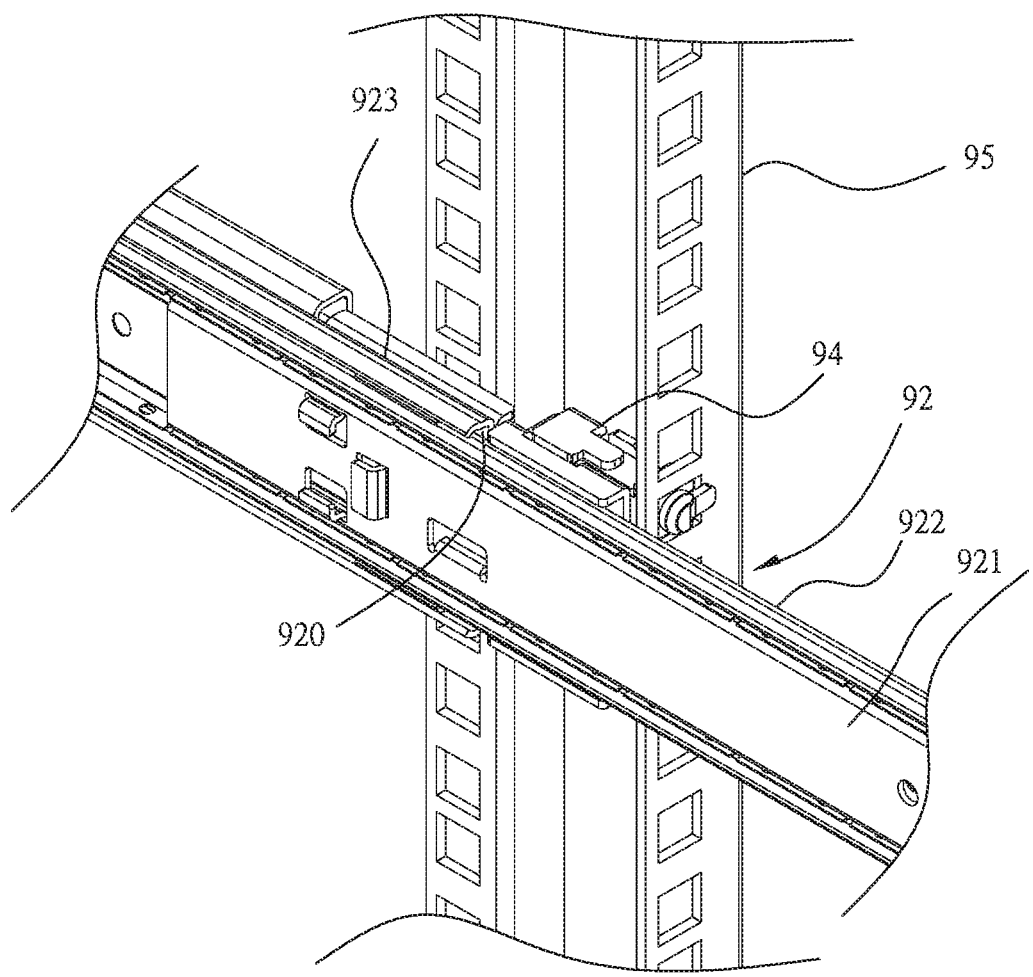
FIG. 4 is an enlarged view of a portion of FIG. 3 where the server sliding rail assembly is connected to the server rack.
Figure 5:
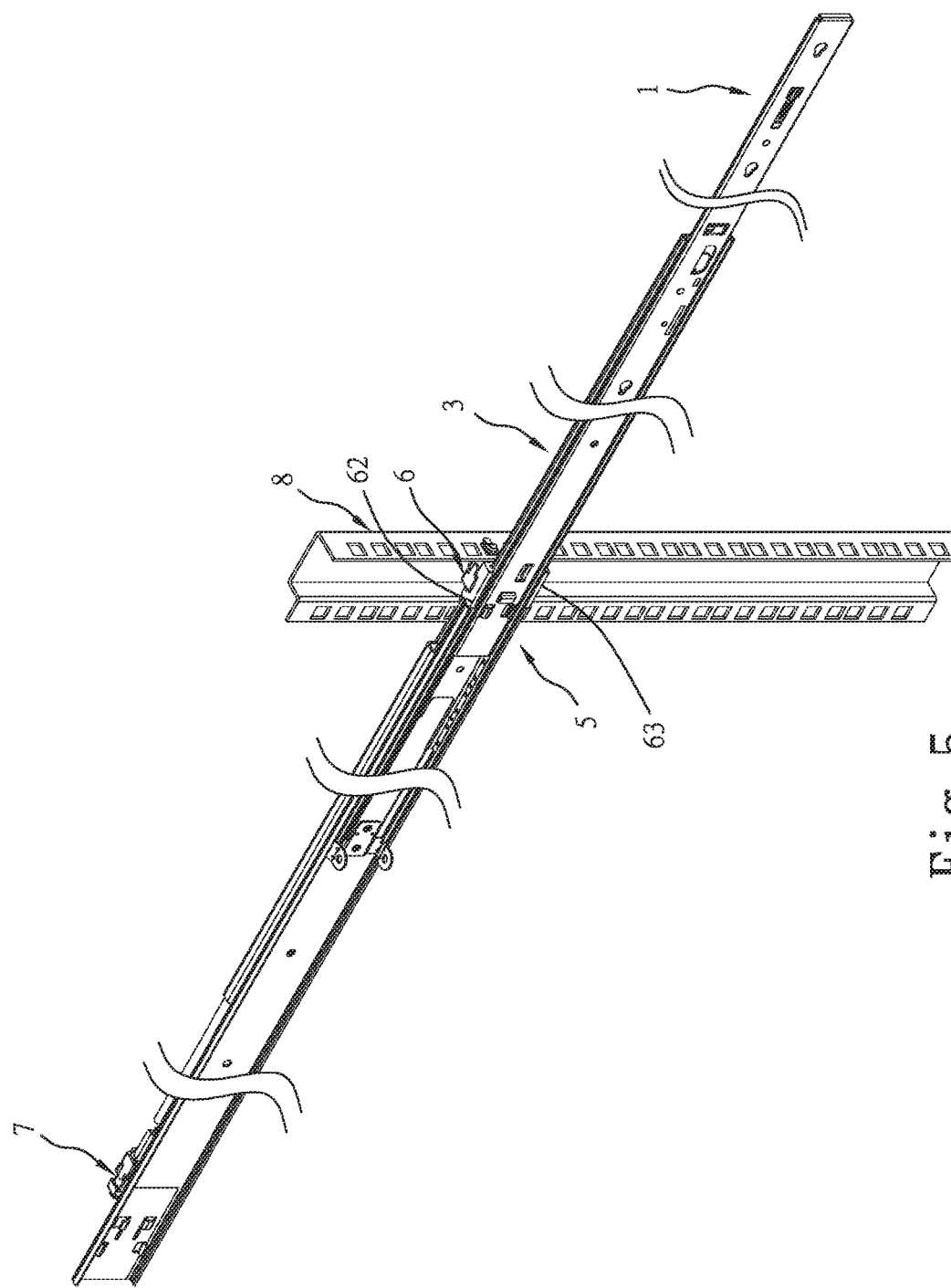
FIG. 5 is a schematic upper perspective view illustrating an extended position of an example reinforced server sliding rail mounting structure in a server rack in accordance with the present invention.
Figure 6:
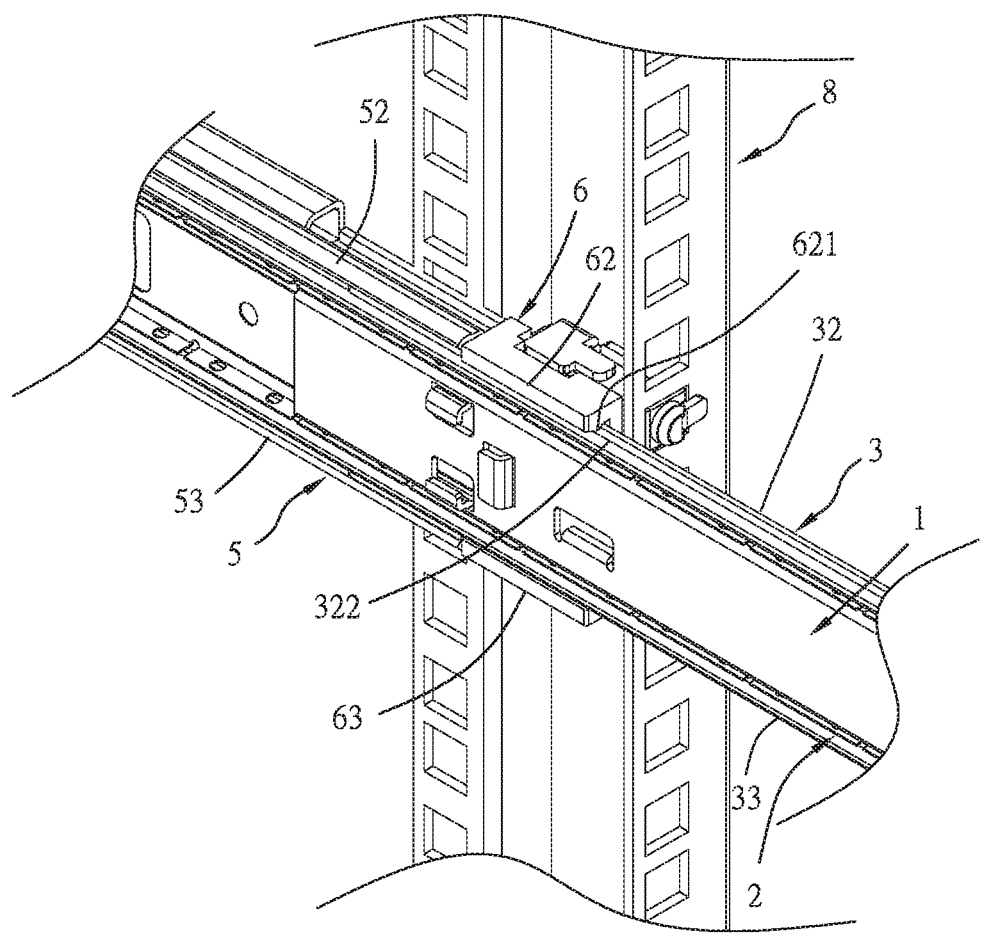
FIG. 6 is an enlarged view of a portion of FIG. 5 where the server sliding rail assembly is connected to the server rack.
Figure 7:
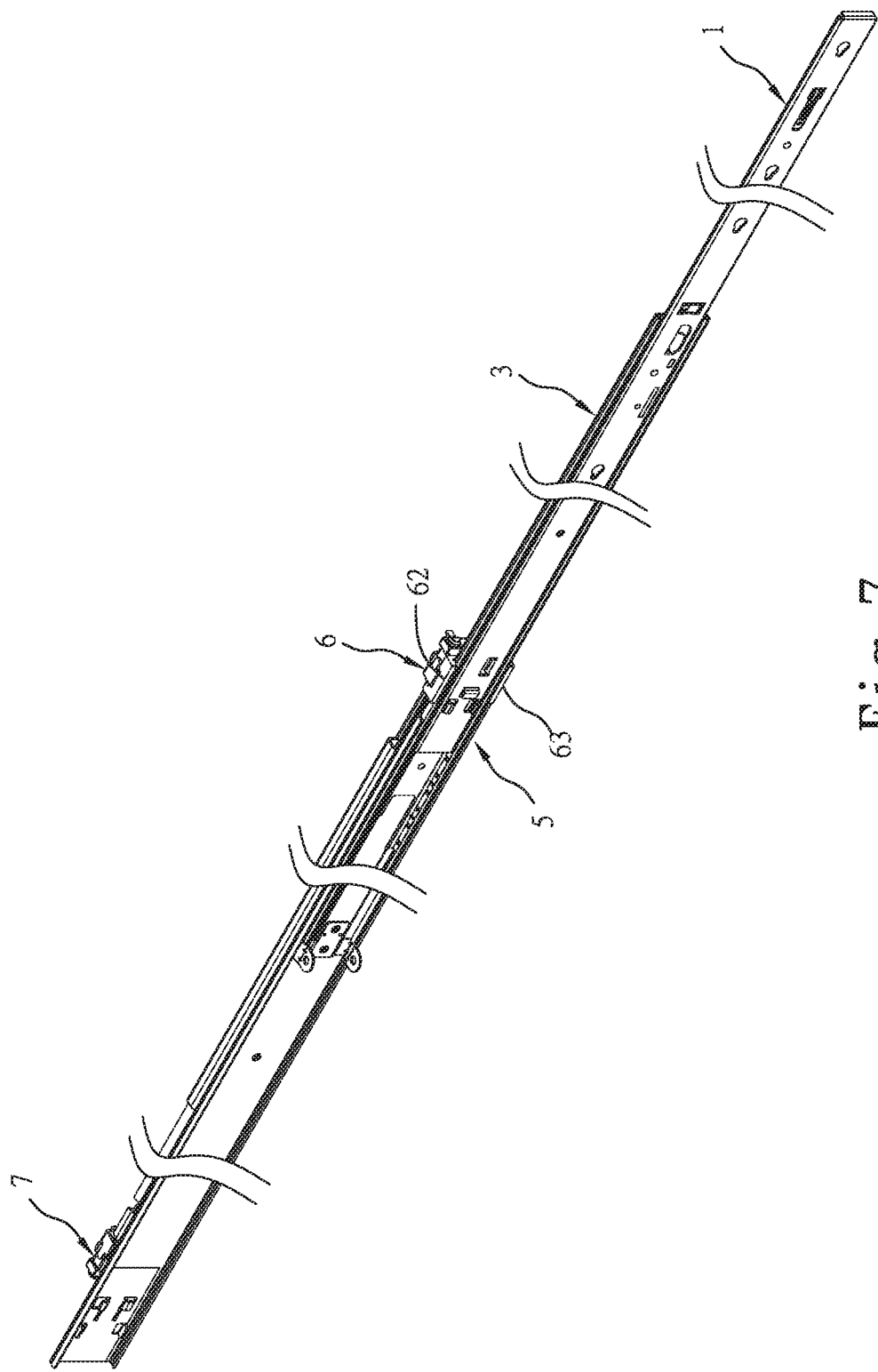
FIG. 7 is a schematic upper perspective view illustrating the example reinforced server sliding rail mounting structure of FIG. 5 in an extended position.
Figure 11:
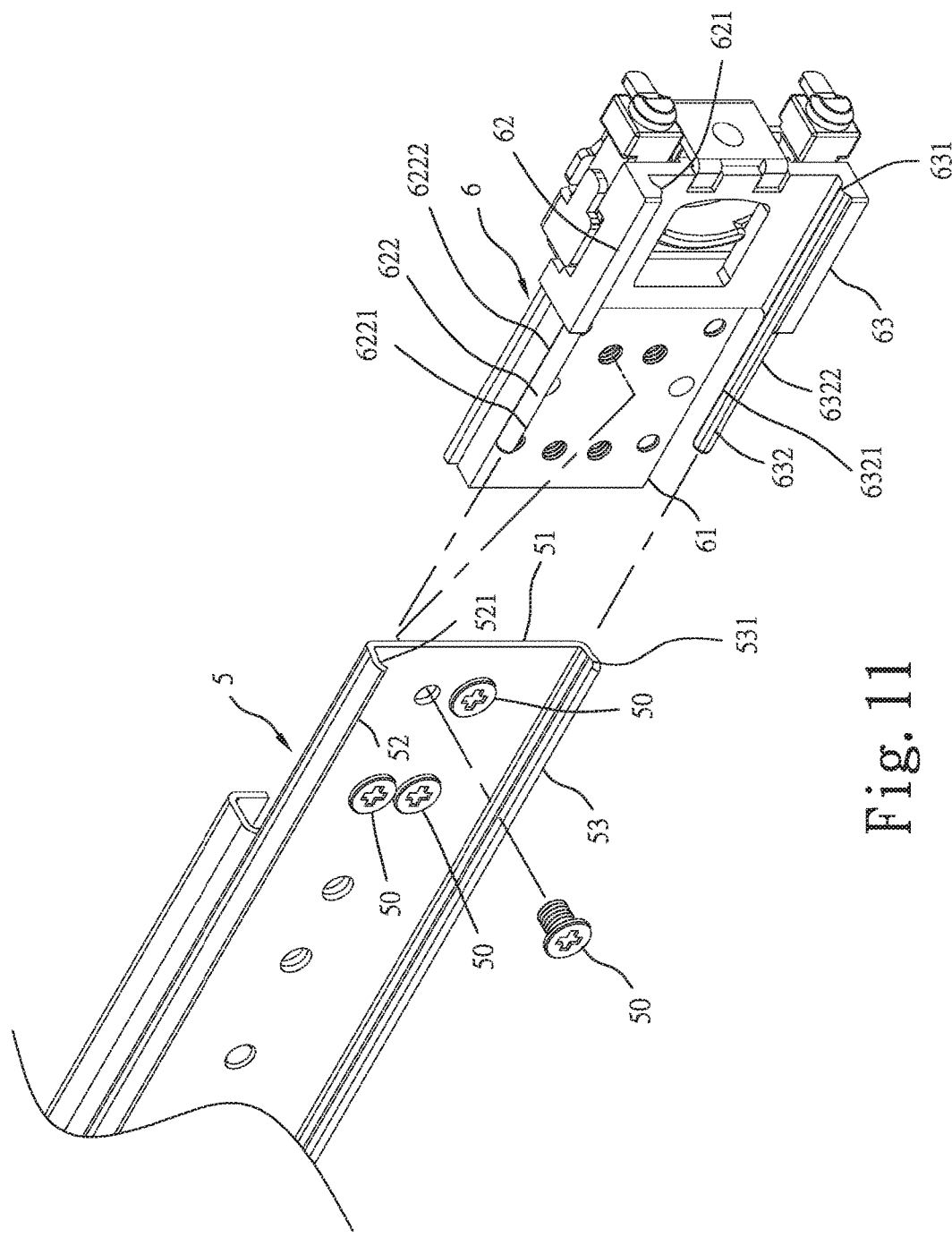
FIG. 11 is an enlarged schematic upper partial exploded perspective view of a portion of the example of FIG. 10, illustrating the mounting relationship between a front bracket and an outer sliding rail.
Figure 12:
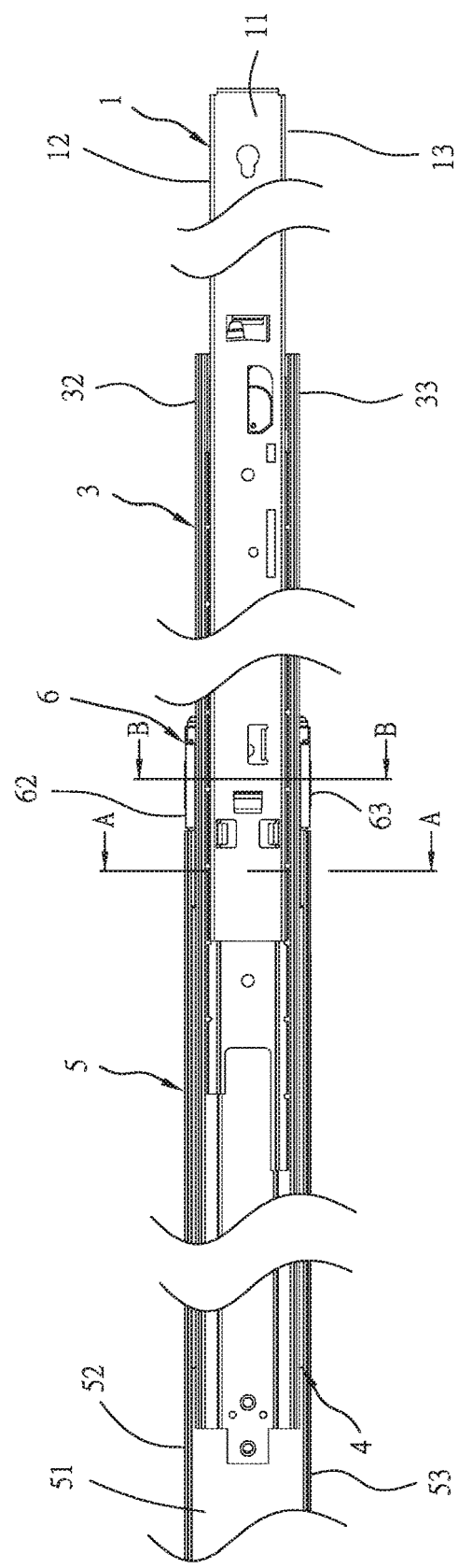
FIG. 12 is a schematic side plan view illustrating the reinforced server sliding rail mounting structure in an extended position.
Figure 13:
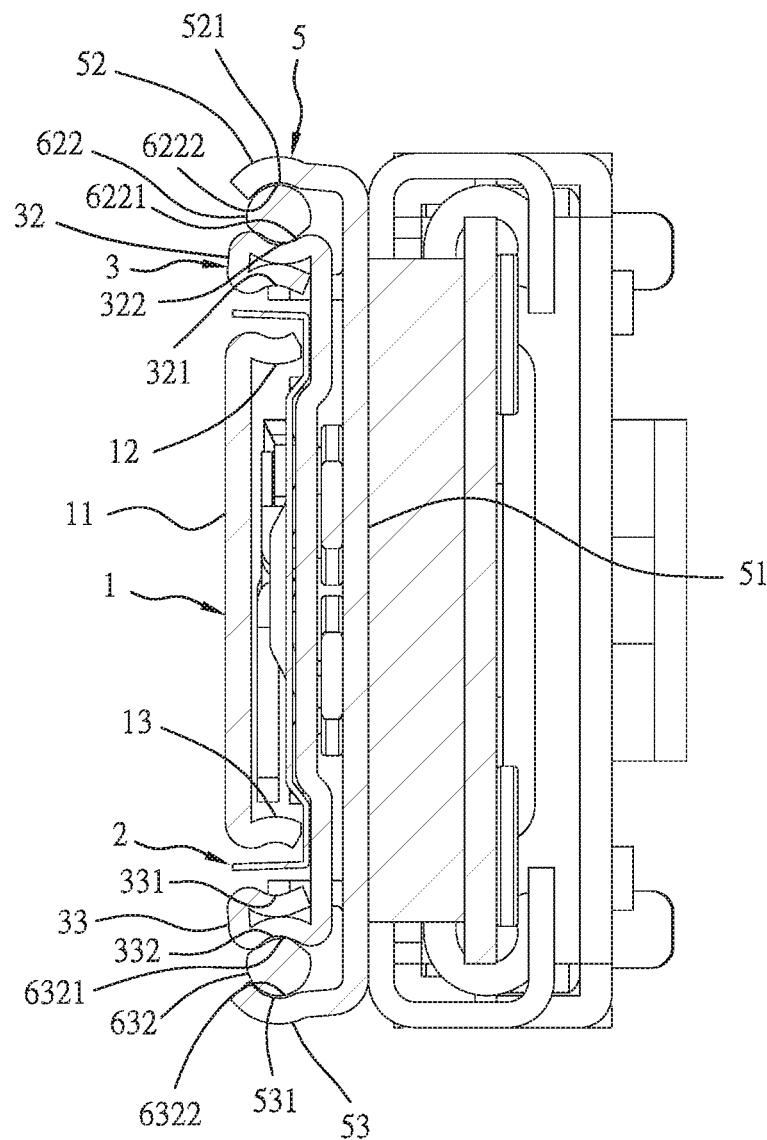
FIG. 13 is an enlarged sectional view taken along section line A-A of FIG. 12.
Figure 14:
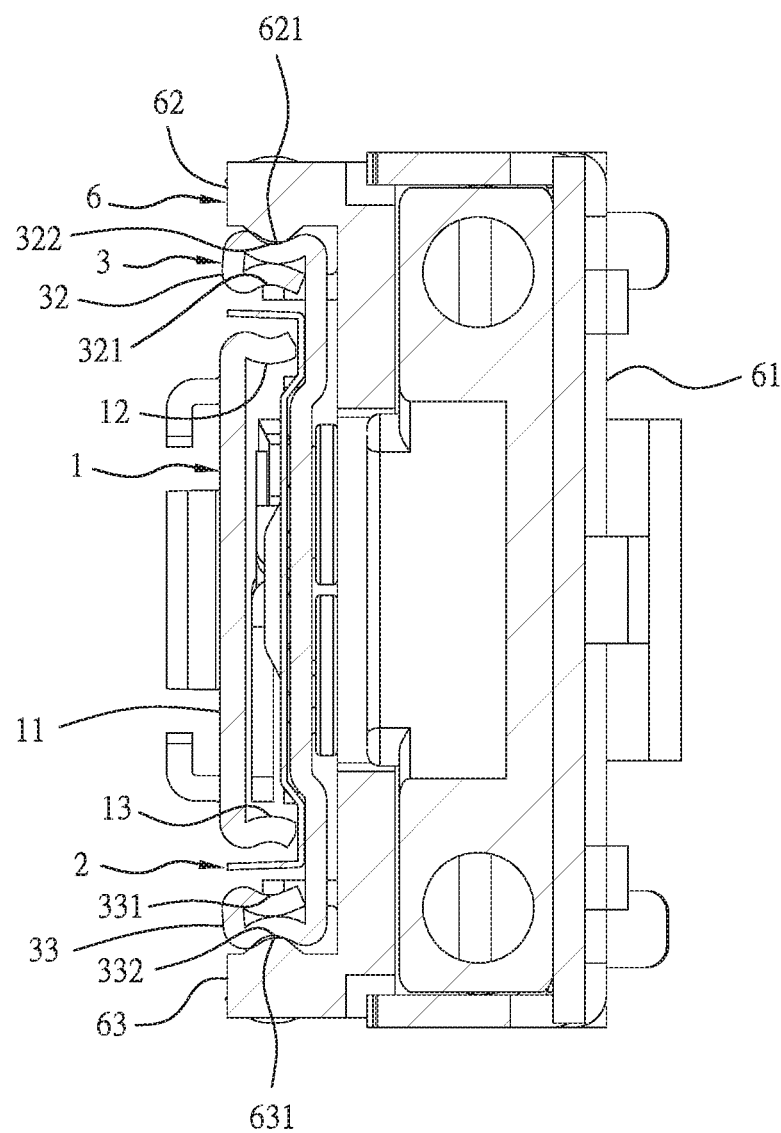
FIG. 14 is an enlarged sectional view taken along section line B-B of FIG. 12.
Figure 15:
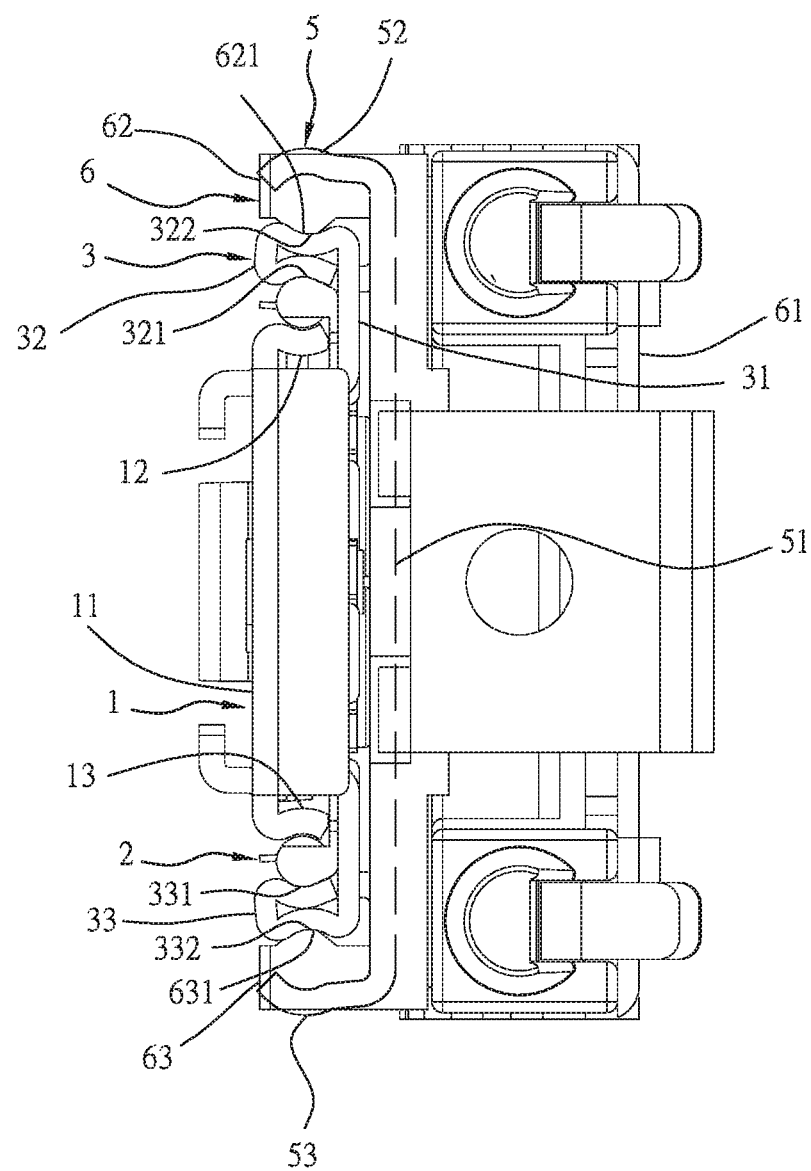
FIG. 15 is an enlarged schematic front view of the reinforced server sliding rail mounting structure of FIG. 9.
Figure 16:
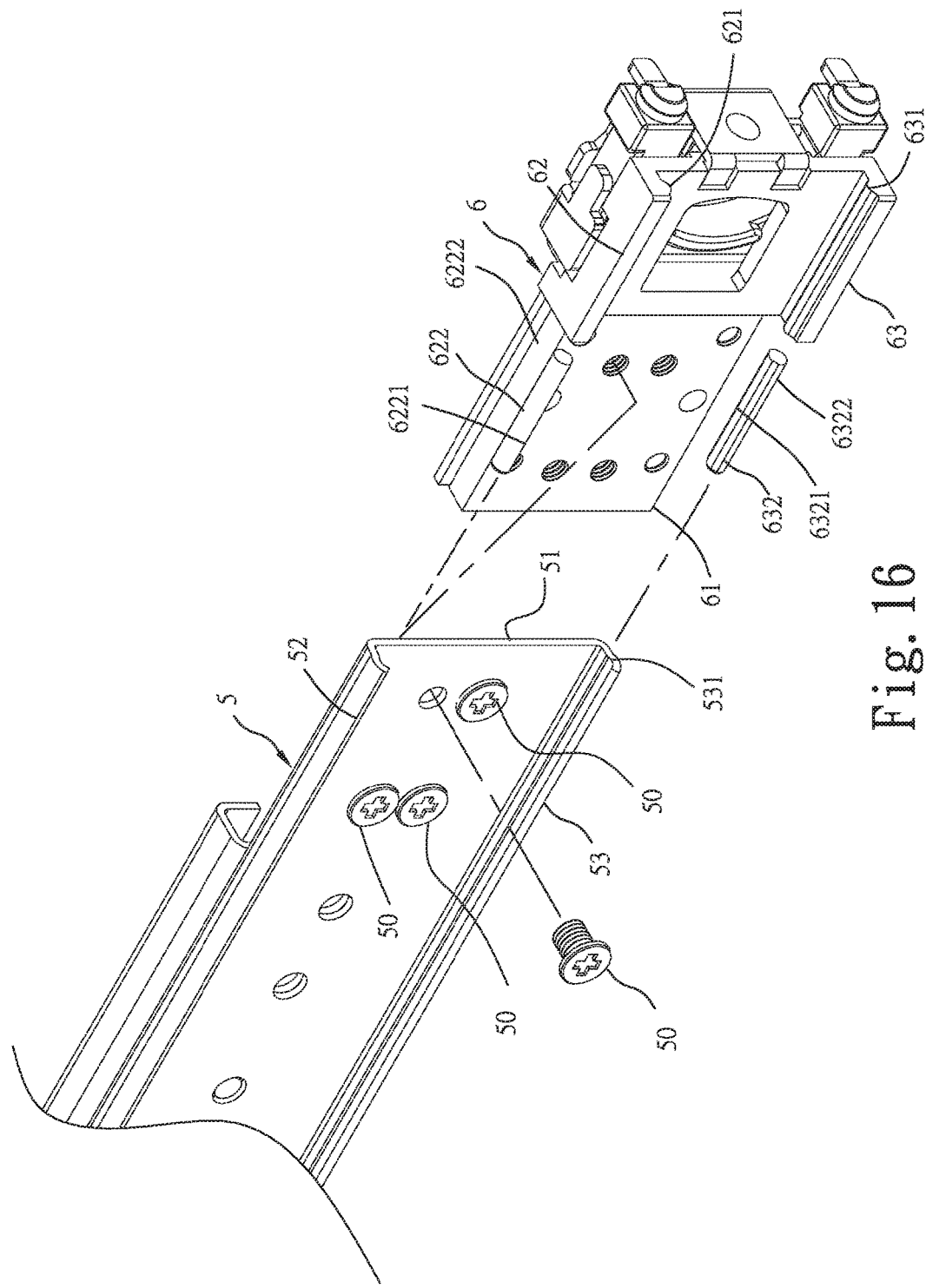
FIG. 16 is an enlarged schematic upper partial exploded perspective view of a portion of the example of FIG. 10, illustrating the mounting relationship between the front bracket and the outer sliding rail and the upper and lower reinforcing ribs of the front bracket kept apart from the top and bottom reinforcing components.
Figure 17:
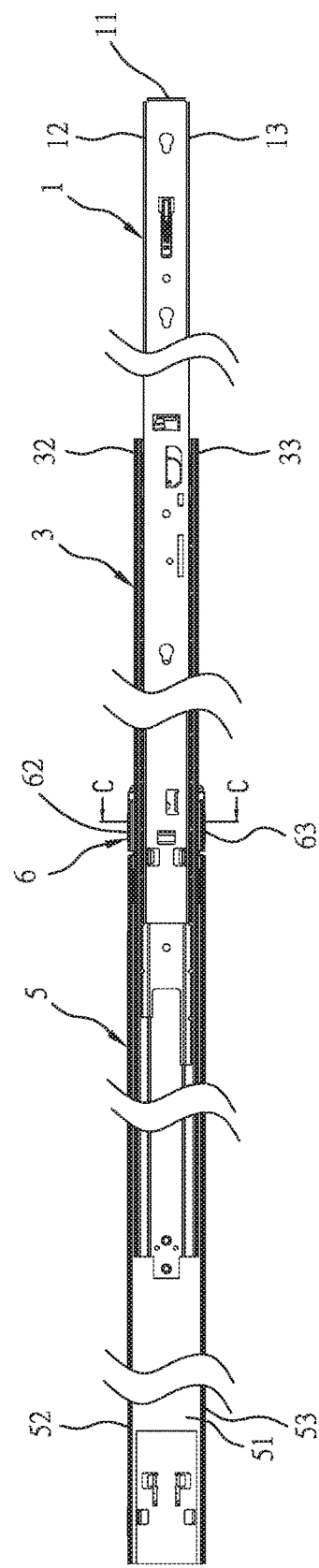
FIG. 17 is another schematic side plan view illustrating the reinforced server sliding rail mounting structure in an extended position.
Figure 18:
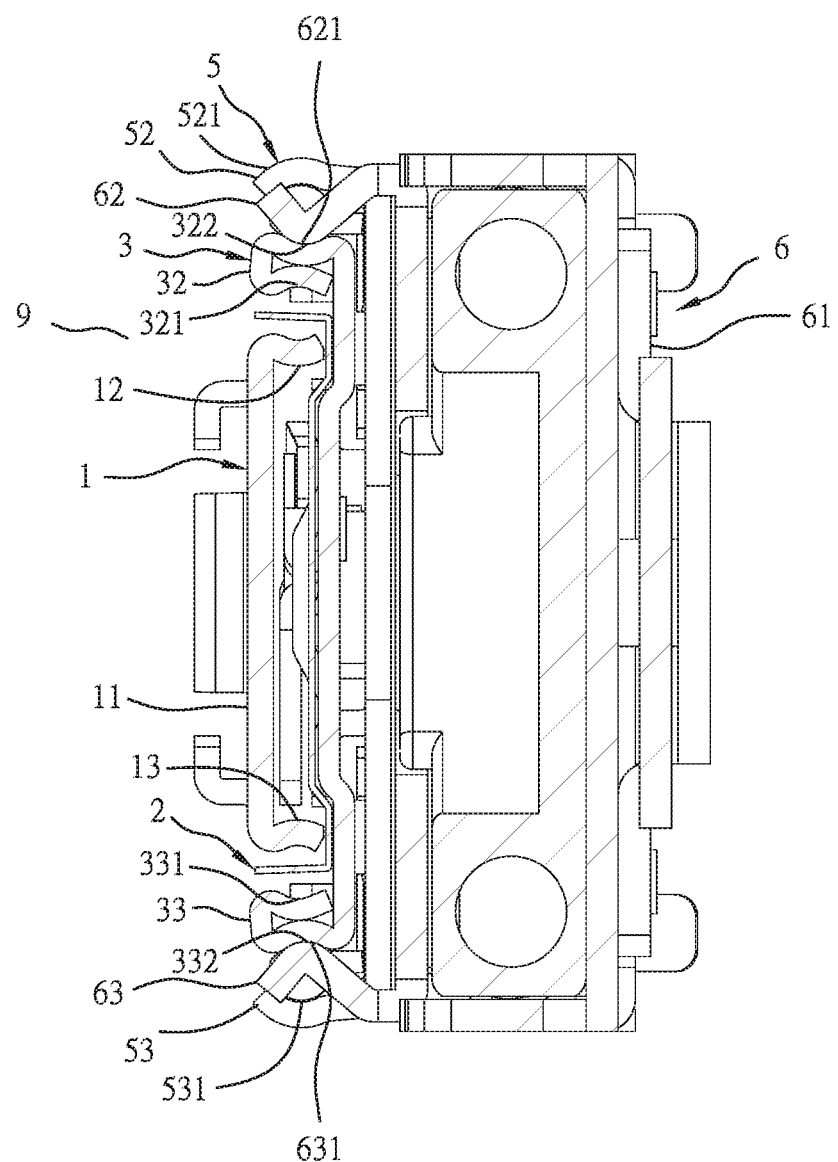
FIG. 18 is an enlarged sectional view taken along section line C-C of FIG. 17.

Referring to FIGS. 5-20, reinforced server sliding rail mounting structures in accordance with the present invention are shown. The reinforced server sliding rail mounting structures shown in FIGS. 5-20 are intended for use with a server rack 95 and server 96, as shown in the view of the prior art device in FIG. 3. The first example reinforced server sliding rail mounting structure shown in FIGS. 5-18 includes an inner sliding rail 1, comprising a main rail wall 11 (see FIGS. 12-15) for connection to a server (not shown) and opposing upper and lower rail walls 12, 13 respectively and perpendicularly extended from opposing top and bottom sides of the main rail wall 11; an intermediate sliding rail 3, comprising a main rail wall 31 (see FIG. 15), an upper rail wall 32 and a lower rail wall 33 respectively and perpendicularly extended from opposing top and bottom sides of the main rail wall 31, inner ball grooves 321, 331 respectively longitudinally located on respective inner surfaces of the upper and lower rail walls 32, 33 and outer ball grooves 322, 332 respectively longitudinally located on respective opposing outer surfaces of the upper and lower rail walls 32, 33; a first ball bushing 2 slidably mounted between the inner sliding rail 1 and the intermediate sliding rail 3; an outer sliding rail 5, comprising a main rail wall 51 (see FIGS. 12, 13 and 15), upper and lower rail walls 52, 53 respectively and perpendicularly extended from opposing top and bottom sides of the main rail wall 51 and inner ball grooves 521, 531 respectively longitudinally located on respective inner surfaces of the upper and lower rail walls 52, 53; a second ball bushing 4 (see FIG. 12) slidably mounted between the intermediate sliding rail 3 and the outer sliding rail 5; and a front bracket 6 and a rear bracket 7 respectively fixedly fastened to opposing front and rear ends of the outer sliding rail 5 by fastening members 50 for mounting on an opposing front side 8 (see FIGS. 5, 9 and 11) and rear side (not shown) of a server rack, which front bracket 6 includes a bracket body 61 and upper and lower bracket walls 62, 63 respectively extended from opposing top and bottom sides of the bracket body 61.

Figure 8:
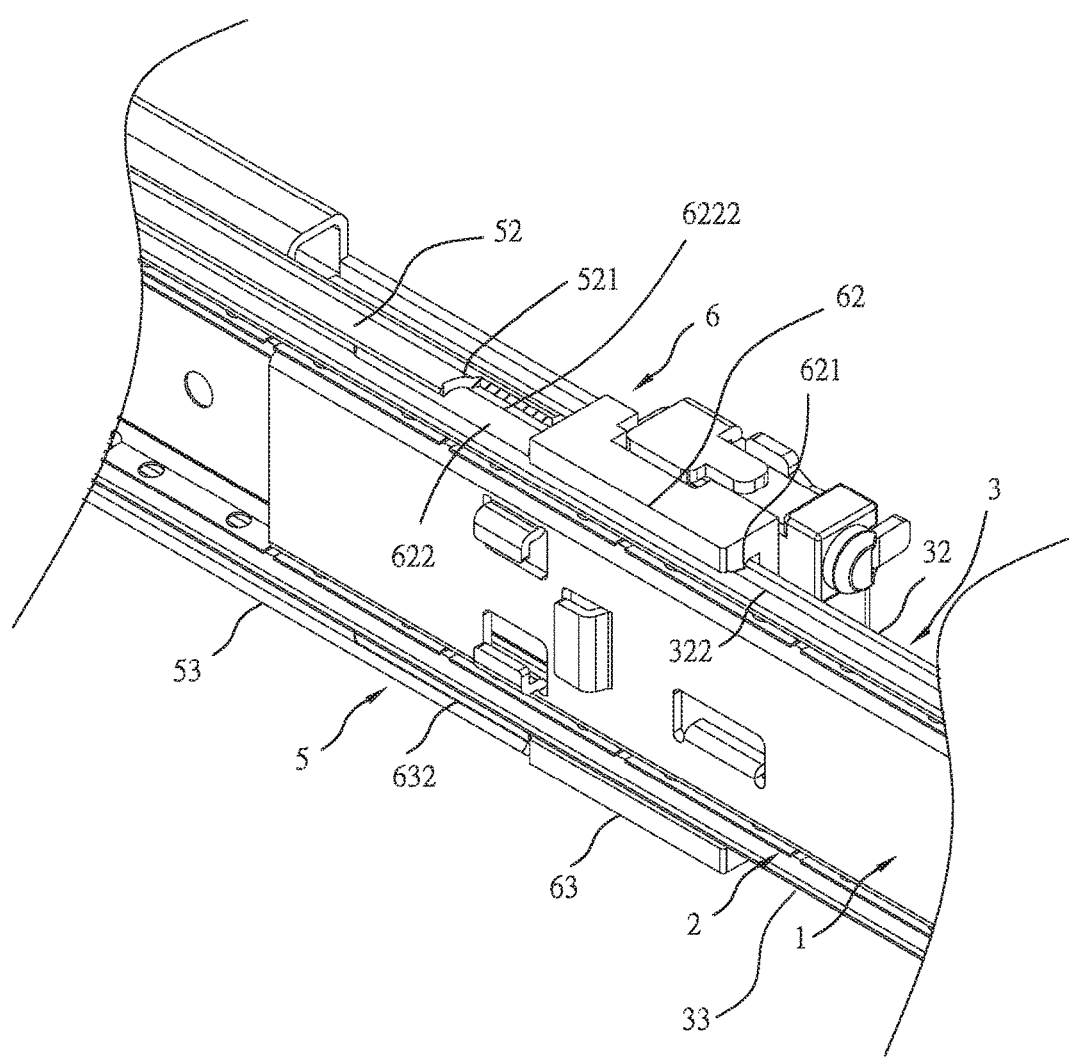
FIG. 8 is an enlarged perspective view of a portion of FIG. 7 where the server sliding rail assembly is connected to the server rack.
Figure 9:
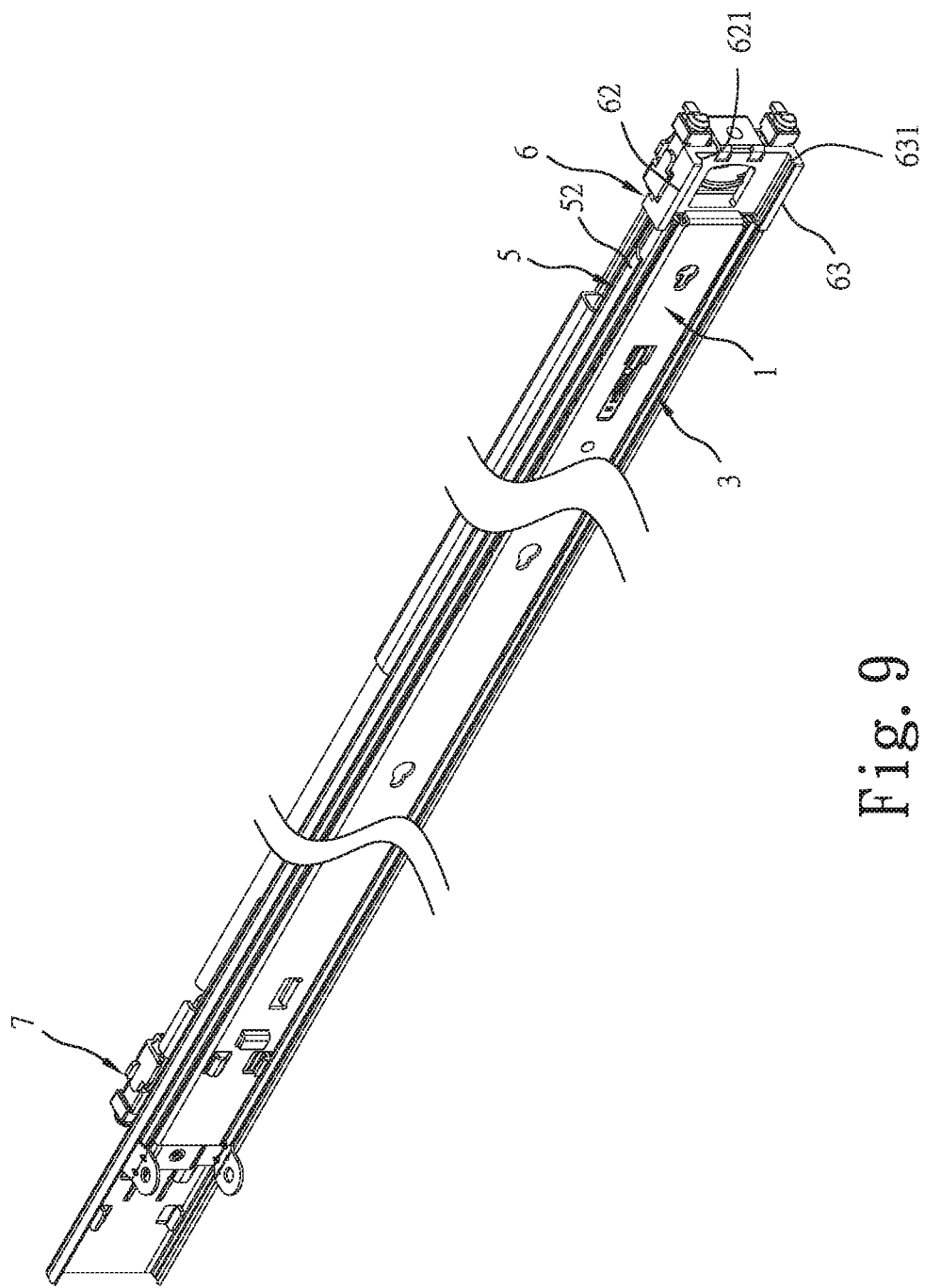
FIG. 9 is a schematic perspective view that corresponds to FIG. 7, illustrating the reinforced server sliding rail mounting structure in an inward position.
Figure 10:
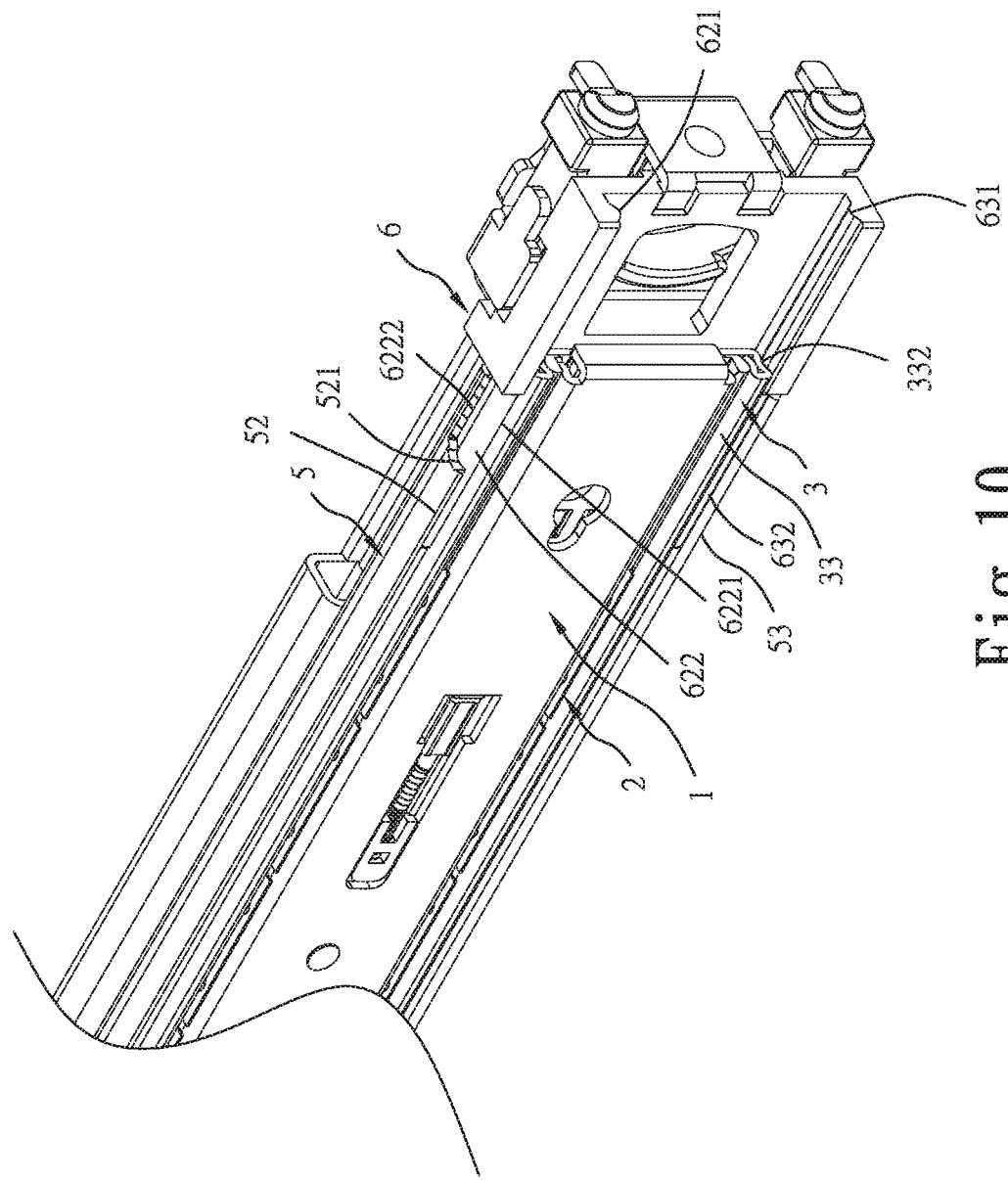
FIG. 10 is an enlarged perspective view of a front portion of FIG. 9.

Thus, the inner sliding rail 1 can be pulled outward while connected to the server (not shown) to carry the intermediate sliding rail 3 outward to an extended position (see FIGS. 5-8 and 12-15), or pushed inward with the server (not shown) to carry the intermediate sliding rail 3 to the inward position (see FIGS. 9 and 10). Since the act of moving a server sliding rail assembly inward or outward between an extended position and an inward position is known in the art, it will not be further detailed here.

The main features of the example reinforced server sliding rail mounting structures are outlined hereinafter.

The front bracket 6 further comprises an upper reinforcing rib 621 and a lower reinforcing rib 631 respectively mounted on the upper bracket wall 62 and the lower bracket wall 63 (see FIGS. 8 and 10). Thus, when the intermediate sliding rail 3 is moved outward into the front bracket 6 (see FIGS. 5-8, 12 and 14), the upper and lower reinforcing ribs 621, 631 are respectively engaged into the outer ball grooves 322, 332 of the intermediate sliding rail 3 to reinforce the structural strength of the intermediate sliding rail 3, and thus, when the server is moved outward with the inner sliding rail 1, the intermediate sliding rail 3 is well reinforced against deformation by the upper and lower reinforcing ribs 621, 631.

The front bracket 6 further comprises top and bottom reinforcing components 622, 632 (see FIGS. 10, 11 and 13) respectively mounted on respective rear ends of the upper and lower reinforcing ribs 621, 631 at the upper and lower bracket walls 62, 63 of the front bracket 6. The top and bottom reinforcing components 622, 632 each have a portion 6221, 6321 thereof adapted for engagement with the outer ball grooves 322, 332 (see FIG. 13) of the intermediate sliding rail 3 respectively, and an opposite portion 6222, 6322 thereof adapted for engagement with the inner ball grooves 521, 531 of the outer sliding rail 5 respectively. Thus, the top and bottom reinforcing components 622, 632 significantly reinforce the structural strength of the coupling area between the intermediate sliding rail 3 and the outer sliding rail 5, avoiding deformation of the server sliding rail assembly due to the heavy loading or human factors when in the extended position.

Further, the rear ends of the upper and lower reinforcing ribs 621, 631 of the upper and lower bracket walls 62, 63 of the front bracket 6 are respectively connected to the top and bottom reinforcing components 622, 632 (see FIGS. 11, 13 and 14), i.e., the upper reinforcing rib 621 and the upper reinforcing component 622 are integrally formed in one piece (for example, formed of zinc alloy integrally); the lower reinforcing rib 631 and the lower reinforcing component 632 are integrally formed in one piece (for example, formed of zinc alloy integrally). Alternatively, the upper and lower reinforcing ribs 621, 631 of the upper and lower bracket walls 62, 63 of the front bracket 6 can be kept apart from the top and bottom reinforcing components 622, 632 outer sliding rail 5 (see FIG. 16).

Figure 19:
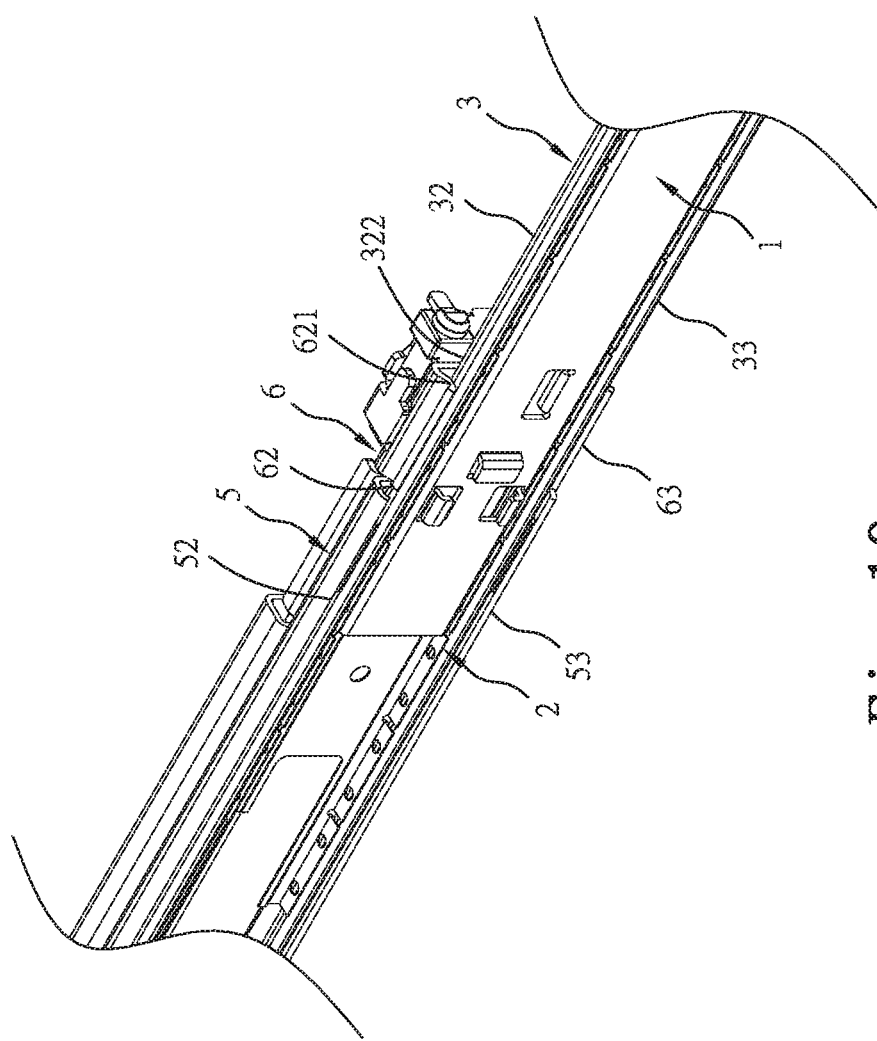
FIG. 19 is an enlarged schematic upper perspective view illustrating an alternative form of the front bracket.
Figure 20:
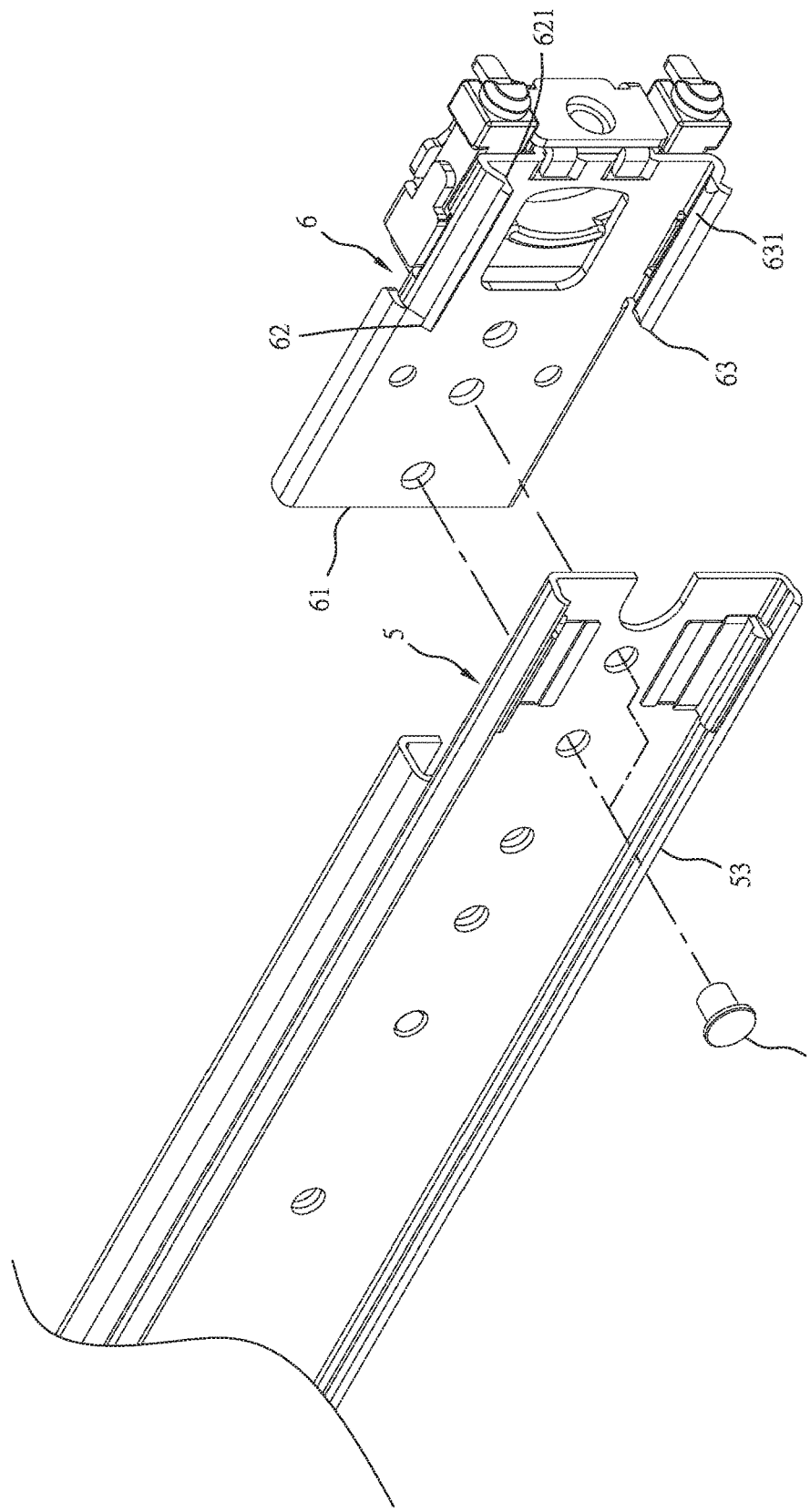
FIG. 20 is an enlarged schematic upper partial exploded perspective view of a portion of FIG. 19, illustrating the configuration of the alternative form of the front bracket.

FIGS. 19-20 illustrate portions of another example of the present invention in the form of an alternative reinforced server sliding rail mounting structure for connection to a server rack and to a server. This alternative example is identical to the first example shown in FIGS. 5-18, other than with respect to the portions shown in FIGS. 19-20. Upon closer inspection, the upper reinforcing rib 621 of the upper bracket wall 62 of the front bracket 6 is integrally formed in one piece, and the lower reinforcing rib 631 of the lower bracket wall 63 of the front bracket 6 is integrally formed in one piece. The upper and lower reinforcing ribs 621, 631 engage the outer ball grooves 322, 332 respectively longitudinally located on respective opposing outer surfaces of the upper and lower rail walls 32, 33 of the intermediate sliding rail 3 to provide reinforcement when the reinforced server sliding rail mounting structure is extended outward to an outward position. The front bracket 6 also is shown as being connected to the outer sliding rail 5 by alternative fasteners, in the form of rivets 50.

In conclusion, the reinforced server sliding rail mounting structure in accordance with the present invention has advantages and features as follows.

An upper reinforcing rib 621 and a lower reinforcing rib 631 are respectively mounted on the upper bracket wall 62 and the lower bracket wall 63, so that when the intermediate sliding rail 3 is moved outward into the front bracket 6 (see FIGS. 5-8, 12, 14 and 19), the upper and lower reinforcing ribs 621, 631 are respectively engaged into the outer ball grooves 322, 332 of the intermediate sliding rail 3 to reinforce the structural strength of the intermediate sliding rail 3, and thus, when the server is moved outward with the inner sliding rail 1, the intermediate sliding rail 3 is well reinforced against deformation by the upper and lower reinforcing ribs 621, 631.

In the first example of FIGS. 5-18, top and bottom reinforcing components 622, 632 (see FIGS. 10, 11 and 13) are respectively mounted on respective rear ends of the upper and lower reinforcing ribs 621, 631 at the upper and lower bracket walls 62, 63 of the front bracket 6, wherein the top and bottom reinforcing components 622, 632 each have a portion 6221, 6321 thereof adapted for engagement with the outer ball grooves 322, 332 (see FIG. 13) of the intermediate sliding rail 3 respectively, and an opposite portion 6222, 6322 thereof adapted for engagement with the inner ball grooves 521, 531 of the outer sliding rail 5 respectively, and thus, the top and bottom reinforcing components 622, 632 significantly reinforce the structural strength of the coupling area between the intermediate sliding rail 3 and the outer sliding rail 5, avoiding deformation of the server sliding rail assembly due to heavy loading or human factors when in the extended position.

What is claimed is:

1. A reinforced server sliding rail mounting structure for connection to a server rack and to a server, comprising:

an inner sliding rail comprising a main rail wall adapted for connection to said server and opposing upper and lower rail walls respectively and perpendicularly extended from opposing top and bottom sides of said main rail wall;

an intermediate sliding rail comprising a main rail wall, an upper rail wall and a lower rail wall respectively and perpendicularly extended from opposing top and bottom sides of said main rail wall of said intermediate sliding rail, inner ball grooves respectively longitudinally located on respective inner surfaces of the said upper and lower rail walls of said intermediate sliding rail and outer ball grooves respectively longitudinally located on respective opposing outer surfaces of said upper and lower rail walls of said intermediate sliding rail;

a first ball bushing slidably mounted between said inner sliding rail and said intermediate sliding rail;

an outer sliding rail comprising a main rail wall, upper and lower rail walls respectively and perpendicularly extended from opposing top and bottom sides of said main rail wall of said outer sliding rail and inner ball grooves respectively longitudinally located on respective inner surfaces of said upper and lower rail walls of said outer sliding rail;

a second ball bushing slidably mounted between said intermediate sliding rail and said outer sliding rail; and a front bracket and a rear bracket respectively connected to opposing front and rear ends of said outer sliding rail by fastening members for connection to an opposing front side and rear side of the server rack, said front bracket comprising a bracket body and upper and lower bracket walls respectively extended from opposing top and bottom sides of said bracket body;

wherein said front bracket further comprises an upper reinforcing rib and a lower reinforcing rib respectively located on said upper bracket wall and said lower bracket wall such that when said intermediate sliding rail is moved outward into said front bracket, said upper reinforcing rib and said lower reinforcing rib are respectively engaged into said outer ball grooves of said intermediate sliding rail and reinforce the structural strength of said intermediate sliding rail; and further comprising a top reinforcing component and a bottom reinforcing component respectively located on respective rear ends of said upper reinforcing rib and said lower reinforcing rib, said top reinforcing component and said bottom reinforcing component each having a portion thereof adapted for engagement with said outer ball grooves of said intermediate sliding rail respectively and an opposite portion thereof adapted for engagement with said inner ball grooves of said outer sliding rail respectively.

2. The reinforced server sliding rail mounting structure for connection to a server rack and to a server of claim 1, wherein said upper reinforcing rib and said lower reinforcing rib of said upper and lower bracket walls of said front bracket have respective rear ends thereof respectively integrally connected to said top reinforcing component and said bottom reinforcing component.

3. The reinforced server sliding rail mounting structure for connection to a server rack and to a server of claim 1, wherein said upper reinforcing rib and said lower reinforcing rib of said upper and lower bracket walls of said front bracket are respectively spaced from said top reinforcing component and said bottom reinforcing component.

* * * * *